United States Patent
Nakajima et al.

(10) Patent No.: US 7,378,687 B2
(45) Date of Patent: May 27, 2008

(54) PHOTOTHYRISTOR DEVICE, BIDIRECTIONAL PHOTOTHYRISTOR DEVICE AND ELECTRONIC APPARATUS

(75) Inventors: Satoshi Nakajima, Yamatotakada (JP); Seigo Okada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 100 days.

(21) Appl. No.: 10/934,013

(22) Filed: Sep. 2, 2004

(65) Prior Publication Data
US 2005/0045908 A1 Mar. 3, 2005

(30) Foreign Application Priority Data
Sep. 2, 2003 (JP) .............................. 2003-310103

(51) Int. Cl.
*H01L 21/00* (2006.01)
*H01L 29/74* (2006.01)
(52) U.S. Cl. ............... 257/113; 257/115; 257/E27.127; 257/E31.071; 438/48
(58) Field of Classification Search ................. 257/113, 257/115; 438/48, 7
See application file for complete search history.

(56) References Cited
U.S. PATENT DOCUMENTS
4,691,220 A * 9/1987 Becke et al. ................. 257/122

5,640,040 A * 6/1997 Nakagawa et al. .......... 257/487
6,037,613 A * 3/2000 Mariyama .................... 257/119
2002/0195629 A1* 12/2002 Okada .......................... 257/292
2006/0027832 A1* 2/2006 Mariyama et al. ........... 257/118

FOREIGN PATENT DOCUMENTS

| JP | 08-130324 | 5/1996 |
|---|---|---|
| JP | 8-264755 | * 10/1996 |
| JP | 2002-190613 | 7/2002 |

* cited by examiner

*Primary Examiner*—A. Sefer
(74) *Attorney, Agent, or Firm*—Morrison & Foerster LLP

(57) ABSTRACT

In order to provide a photothyristor having high breakdown voltage and less-varying light sensitivity by improving the sensitivity and the breakdown voltage of the device while maintaining the device small, the device includes a silicon substrate, a transistor portion including an anode region, a gate region and a cathode region and placed on a first main surface of the silicon substrate, a light-receiving portion for receiving light from the outside, and an electrode for establishing an ohmic contact between the anode region and the cathode region. The light receiving portion includes an oxygen-doped polysilicon film overlaid on the silicon substrate through a transparent insulating film and is disposed to surround the transistor portion. The electrode is placed above the transistor portion and has a double-structure consisting of a center portion and an outer portion surrounding the center portion, and the center portion and the outer portion are electrically connected.

12 Claims, 9 Drawing Sheets

LED

PHOTOTHYRISTOR DEVICE, BIDIRECTIONAL PHOTOTHYRISTOR DEVICE AND ELECTRONIC APPARATUS

This nonprovisional application is based on Japanese Patent Application No. 2003-310103 filed with the Japan Patent Office on Sep. 2, 2003, the entire contents of which are hereby incorporated by reference.

BACKGROUND OF THE INVENTION

1. Field of the Invention

The present invention relates to a photothyristor device, a bidirectional photothyristor device and an electronic apparatus having high breakdown voltage. More particularly, the invention relates to a photothyristor device, a bidirectional photothyristor device and an electronic apparatus for use with a light-triggered SSR (Solid State Relay).

2. Description of the Background Art

Conventionally, there has been known a field plate structure in a high breakdown voltage photothyristor device as shown in FIGS. 7 and 8. Referring to FIGS. 7 and 8, an n-type diffusion region 102 serving as a channel stopper is formed on the perimeter of the surface of an n-type silicon substrate 101. Inside n-type diffusion region 102, an anode diffusion region 103 (103'), a p-type gate diffusion region 104 (104'), a gate resistance diffusion region 105 (105'), and a cathode diffusion region 106 (106') are formed by selective diffusion. Oxide films 110 are formed as insulating films covering the region of n-type silicon substrate 101 ranging from n-type diffusion region 102 to anode diffusion region 103 (103'), and the region of n-type silicon substrate 101 ranging from anode diffusion region 103 (103') to p-type gate diffusion region 104' (104) and gate resistance diffusion region 105 (105'). On oxide film 110 on the region of n-type silicon substrate 101 from n-type diffusion region 102 to anode diffusion region 103 (103'), a semi-insulating oxygen-doped polysilicon film 111 is placed. A silicon nitride film 112 is placed thereon.

In a ch1 (channel 1) of the two photothyristor devices, a T1 electrode 107 and a channel stopper electrode 108 are in ohmic contact with anode diffusion region 103 and n-type diffusion region 102, respectively. Also, in a ch2 (channel 2), a T2 electrode 107' and channel stopper electrode 108 are in ohmic contact with anode diffusion region 103' and n-type diffusion region 102, respectively. When ch1 is operated and a positive bias is applied to T1 electrode 107, a negative (−) potential is applied to p-type diffusion region 104 through T2 electrode 107' for reverse-biasing, and a positive (+) potential is applied to n-type diffusion region 102 through channel stopper electrode 108.

Due to the voltage relationship as described above, a small current is generated in oxygen-doped polysilicon film 111 between T2 electrode 107' and channel stopper electrode 108. Fixed charge is generated in the field area at the surface of the device by oxygen-doped polysilicon film 111. Further, a depletion layer is generated from p-type gate diffusion regions 104 toward the silicon substrate. Here, it is necessary to control the small current in oxygen-doped polysilicon film 111 to generate desired fixed charge. This may cause a leak current in the device; therefore, the film quality must be optimized.

The voltage relationship described above alleviates concentration of the electrical field within the device, thereby improving the breakdown strength of the device. In FIGS. 7 and 8, T1 electrode 107 and T2 electrode 107' are extended toward the channel stopper electrode beyond the pn junctions at the n-type silicon substrate 101 surface, in order to facilitate the field plate effect of T1 electrode 107 and T2 electrode 107'. Namely, if such a structure are not employed, depending on the resistivity of oxygen-doped polysilicon film 111, a positive fixed potential, called Qss, and positive charge of natrium or the like within oxygen-doped polysilicon film 111 would cause the surface of n-type substrate 101 to be further n-typed, making it difficult to expand a depletion layer from p-type anode diffusion region 103 (103') toward n-type silicon substrate 101. This would result in a breakdown in the vicinity of the pn junction interface at the surface of anode diffusion region 103 (103 '). In order to prevent this, electrodes 107 and 107' are extended to form a so-called overlay structure.

Next, an example of another conventional high breakdown strength photothyristor will be described with reference to FIGS. 9 and 10 (see Japanese Patent Laying-Open Nos. 08-130324 and 2002-190613). In the example of the prior art shown in FIGS. 9 and 10, a portion 13, which is adjacent to electrode 107 (107'), of oxygen-doped polysilicon film 111 for generating a fixed-potential in the field area is selectively doped with impurities such as phosphate or boron to make a low-resistant portion at this portion. Electrode 107 (107') is placed not to be overlaid on the upper portion of the pn junction interface between anode diffusion region 103 (103') and p-type gate diffusion region 104 (104') and the silicon substrate, at the surface of n-type silicon substrate 101, and low-resistance portion 113 which is optically transparent is used as a field plate electrode.

With such a structure, the light-receiving area is increased without affecting the breakdown strength; therefore, a high sensitivity light-receiving device may be realized.

Photoelectric devices such as photodiodes, phototransistors and photothyristors are required to have high light-sensitivity for incident light and also required to convert light signals into electrical signals with the smallest possible chip size. However, in order to realize a high breakdown voltage characteristic, in the case of the photothyristor shown in FIG. 8, a field plate electrode of Aluminum (Al) etc., must be overlaid on the pn junctions having a high sensitivity. This results in significant reduction of the light sensitivity.

Also, with the method which dopes the high resistance film with impurities for improving the light sensitivity as disclosed in Japanese Patent Laying-Open Nos. 08-130324 and 2002-190613, Qss is increased due to the impurity doping and an unnecessary level is generated at the n-type silicon substrate surface. This causes, in the case of a photothyristor, reduction or variations in the current amplification factor $h_{FE}$ of the lateral type pnp transistor. This leads to variations of the light sensitivity.

SUMMARY OF THE INVENTION

The present invention is made to solve the above problems, and an object thereof is to provide a photothyristor device, a bidirectional photothyristor device and an electronic apparatus employing such devices which have high sensitivity, less-varying light sensitivity, and high breakdown voltage while maintaining the area of the device small.

The photothyristor device according to the present invention includes a silicon substrate, a transistor portion including an anode region, a gate region and a cathode region and placed on a first main surface of the silicon substrate, a light-receiving portion for receiving light from the outside, and an electrode electrically connected to one of the anode region and the cathode region. The light receiving portion includes an oxygen-doped polysilicon film placed above the silicon substrate and is disposed to surround the transistor portion. The electrode is placed above the transistor portion and has a double-structure consisting of a center portion and an outer portion surrounding the center portion, and the center portion and the outer portion are electrically connected.

As described above, the electrode has a double-structure consisting of a center portion and an outer portion, and the center portion and the outer portion is connected. Therefore, an opening portion consisting of two portions forms a light-transmitting portion at the light-receiving portion, and the light sensitivity may be enhanced without increasing the area. Further, the outer electrode is contacted with the oxygen-doped polysilicon film to stabilize the electrical potential across the opening portion of the oxygen-doped polysilicon film, enabling maintaining the breakdown voltage high.

The term "the electrode is placed on the transistor portion" means that the electrode may be either placed on the transistor portion with these being in contact with each other or is placed above the transistor portion with another film being interposed therebetween. Also, there is no restriction on the magnitude relation between the electrode and the transistor portion in a plan view.

Also, even in the structure in which the oxygen-doped polysilicon film is doped with impurities, the electrical potential across the opening portion at the oxygen-doped polysilicon film may be stabilized by using the above method. This may alleviate the influence of the impurity doping on the interface of silicon substrate. In addition, there may be a PSG film or BSG film interposed between the outer electrode and the oxygen-doped polysilicon film.

With the photothyristor device, the bidirectional photothyristor device and the electronic apparatus according to the present invention, it is possible to realize a high breakdown voltage, a high light sensitivity and a stabilized light sensitivity of the device, while maintaining the area of the device small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Next, embodiments of the present invention will be described with reference to the drawings.

First Embodiment

Figure 1:
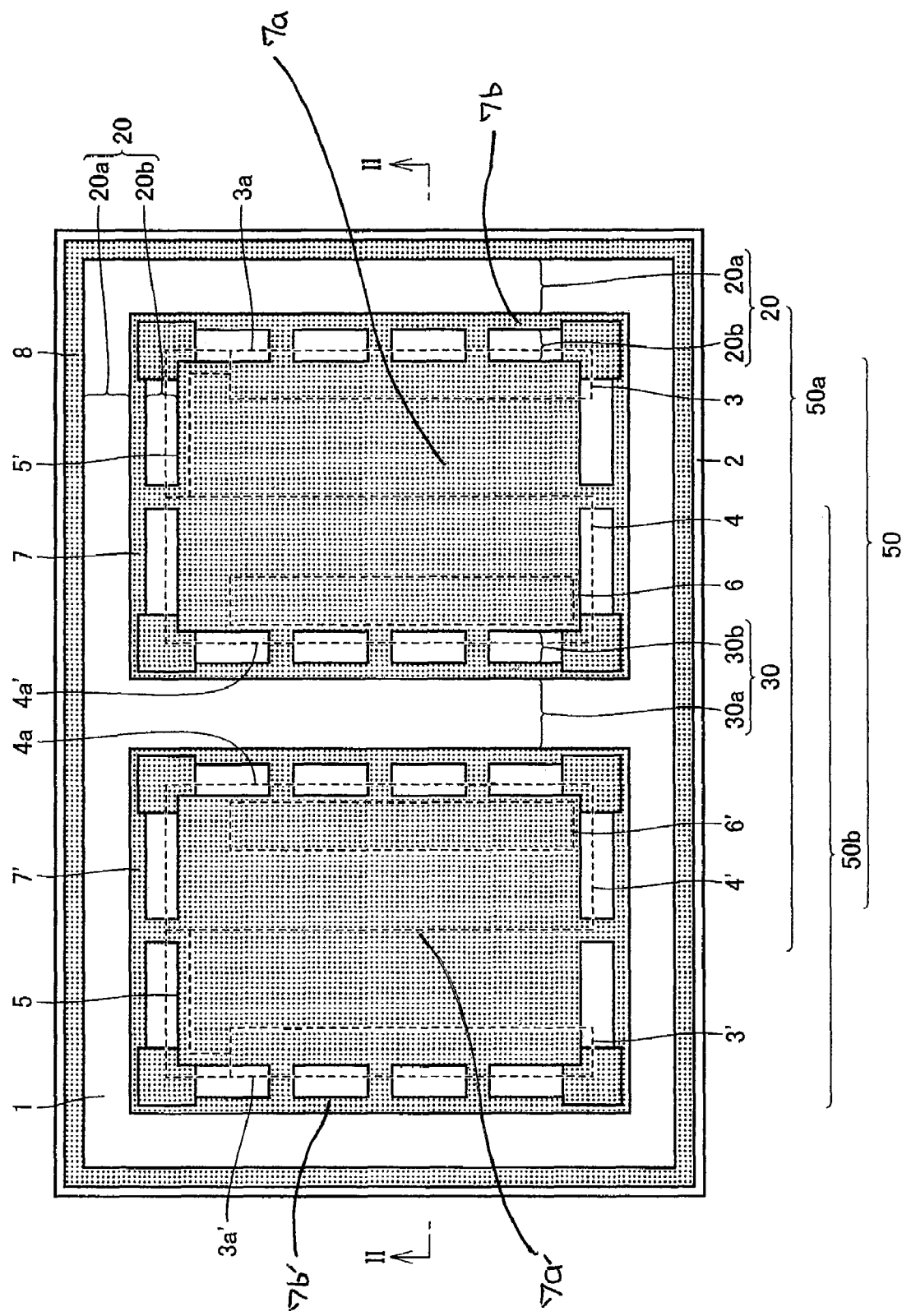
FIG. 1 is a plan view of a bidirectional photothyristor device according to a first embodiment of the present invention.
Figure 2:
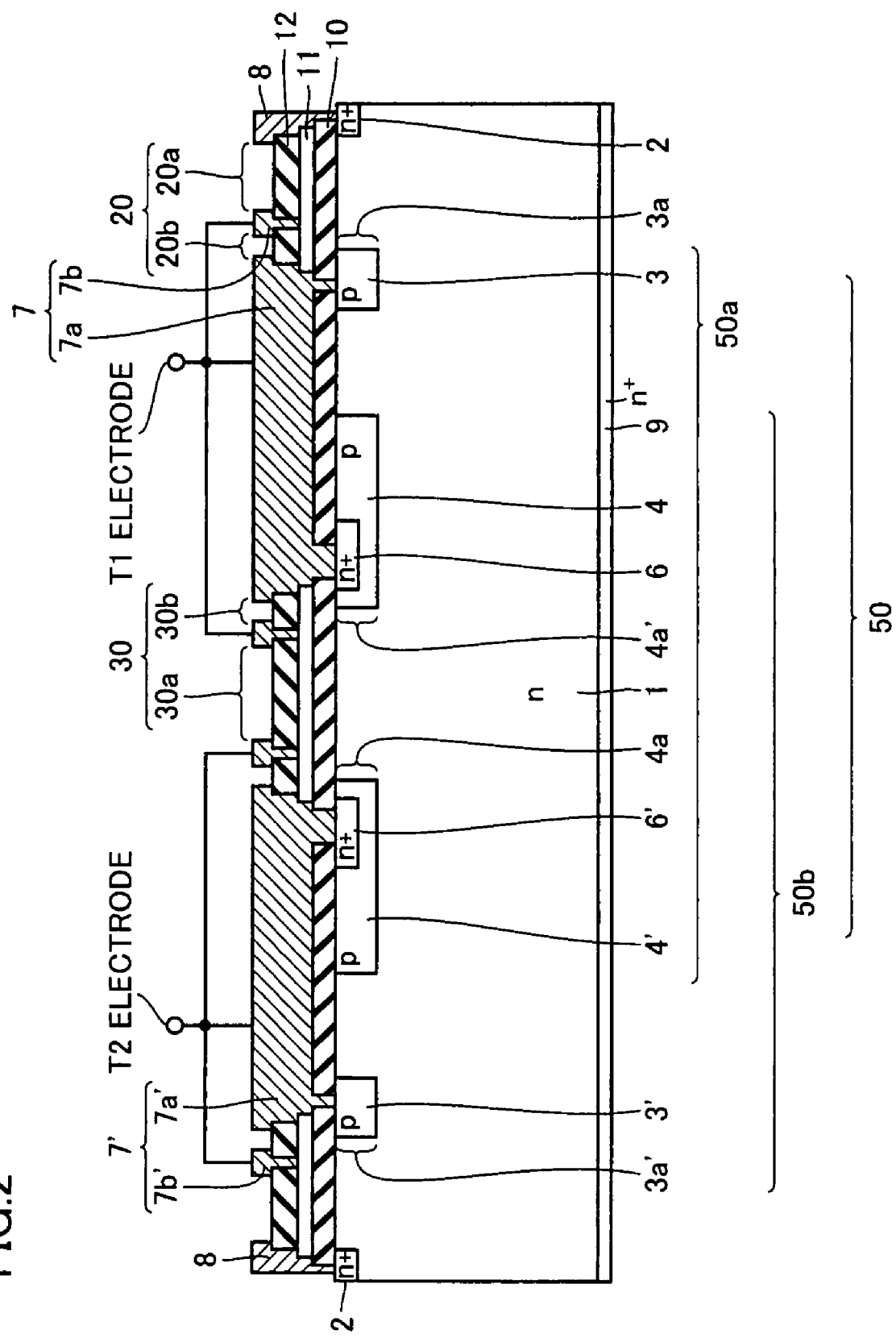
FIG. 2 is a cross sectional view taken along line II-II of FIG. 1.

FIG. 1 is a plan view of a bidirectional photothyristor according to a first embodiment of the present invention. FIG. 2 is a cross sectional view taken along line II-II of FIG. 1. Referring to FIGS. 1 and 2, a bidirectional photothyristor 50 according to this embodiment includes two photothyristor devices 50a, 50b. The two photothyristor devices have the same structure, and therefore the description will be given by describing reference characters of corresponding components in parentheses.

Bidirectional photothyristor device 50 includes an n-type silicon substrate 1, n-type diffusion regions 2 and 9, anode diffusion regions 3 (3'), p-type gate diffusion regions 4' (4), gate resistance diffusion regions 5 (5'), and cathode diffusion regions 6' (6). Further, the above bidirectional photothyristor device includes electrodes 7 (7') (in the case where one of them is an anode electrode, the other is a cathode electrode), a channel stopper electrode 8, oxide films 10, oxygen-doped polysilicon films 11, and silicon nitride films 12.

An electrode 7 (7') having a double-structure includes a center portion 7a (7a') and the end portion of the center portion 7a (7a') is placed not to cover the portions 3a (3a'), 4a' (4a) of the pn junctions which face to the light-receiving portions, the pn junctions being formed between anode diffusion region 3 (3'), p-type gate diffusion region 4' (4) and gate resistance diffusion region 5' (5) and n-type substrate 1. Therefore, the aforementioned portions 3a (3a'), 4a' (4a) of the pn junctions which face to the light-receiving portions are not obstructed by the electrode and therefore may be irradiated with incident light. This enables ensuring favorable light sensitivity.

Referring to FIG. 1, electrode 7 (7') has a double structure consisting of center portion 7a (7a') and an outer portion 7b (7b') and these electrodes are connected by bridge portions made of the same material as center portion 7a (7a') and outer portion 7b (7b'). Therefore, an opening portion 20 consisting of two portions 20a, 20b forms a portion for transmitting light within the light-receiving portion, at the outer edge facing to channel stopper electrode 8. This may improves the light sensitivity without increasing the area of the device. Further, an opening portion 30 consisting of two portions 30a, 30b forms a portion for transmitting light within the light-receiving portion, between the two photothyristor devices. Center portion 7a (7a') and outer portion 7b (7b') of the electrode are spaced apart from each other by a distance of 50 to 1000 μm. The outer electrode, as well as the center electrode, is contacted with oxygen-doped polysilicon film 11, as shown in FIG. 2, to stabilize the electrical potential across the region of the oxygen-doped polysilicon film which lies within the opening portion, for ensuring high breakdown strength.

The light-receiving portions are not specifically shown herein and are defined as opening portions 20a, 20b, 20, 30a, 30b and 30 and the regions lying thereunder. Also, a transistor portion is defined as the portion including the anode region, the cathode region and the gate region. The transistor portion may be deemed to be either in contact with the light receiving portions or partially overlaid thereon.

As previously described, the electrical potential is equalized across the region of oxygen-doped polysilicon film 11 which lies between the contact portion of outer portion 7b and the contact portion of center portion 7a, which may stabilize the electrical potential within the oxygen-doped polysilicon film. As a result, the spread of a depletion layer at the surface of this region may be aided by the aforementioned field plate effect to realize higher breakdown strength. Furthermore, as previously described, center portion 7a and outer portion 7b of electrode 7 may be spaced apart from each other by a distance of 50 μm to 1000 μm to provide a sufficiently large opening portion at the light-receiving portion, ensuring excellent light sensitivity. Consequently, excellent light sensitivity and breakdown strength may be simultaneously realized.

Second Embodiment

Figure 3:
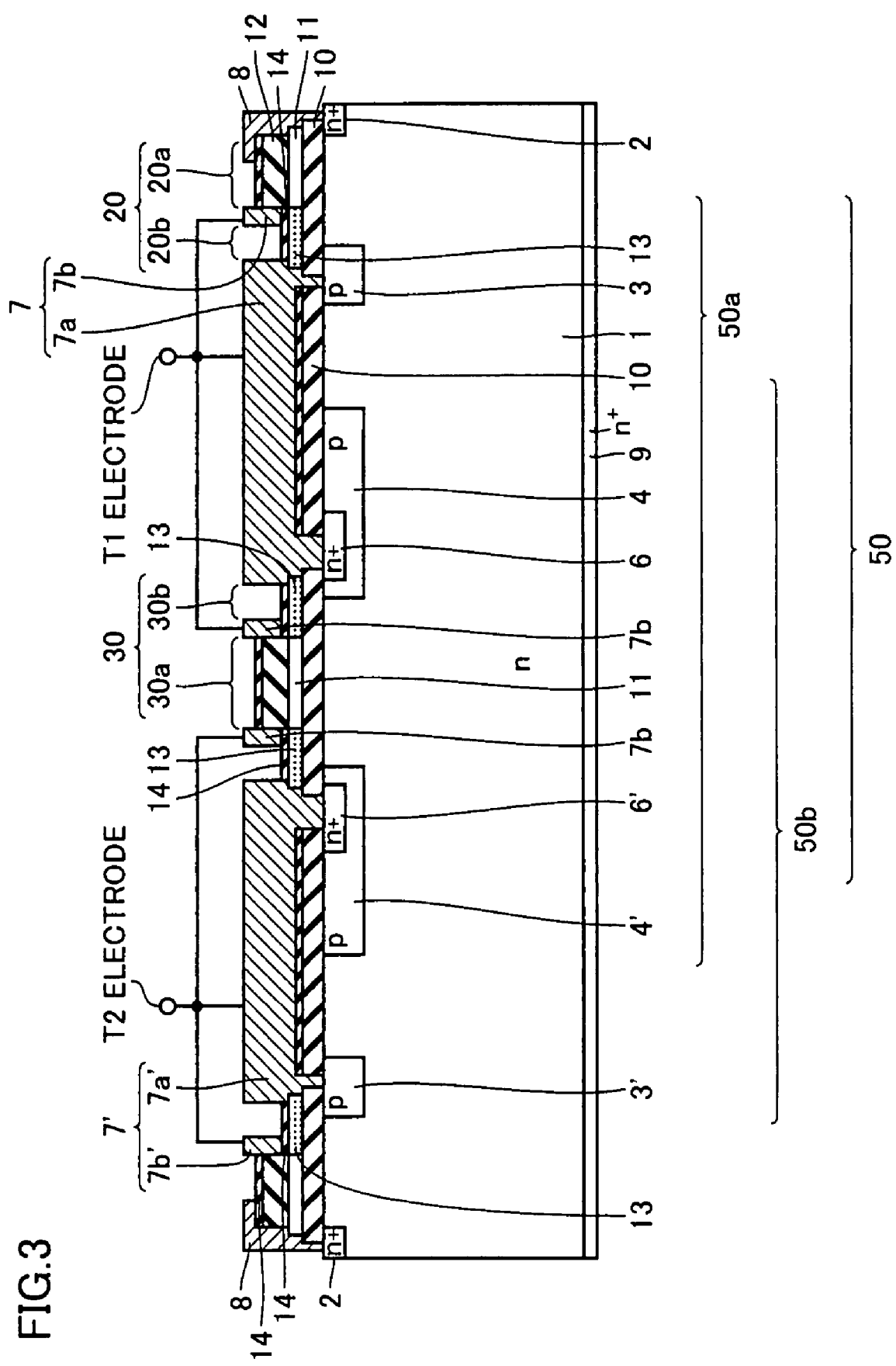
FIG. 3 is a plan view of a bidirectional photothyristor device according to a second embodiment of the present invention.
Figure 9:
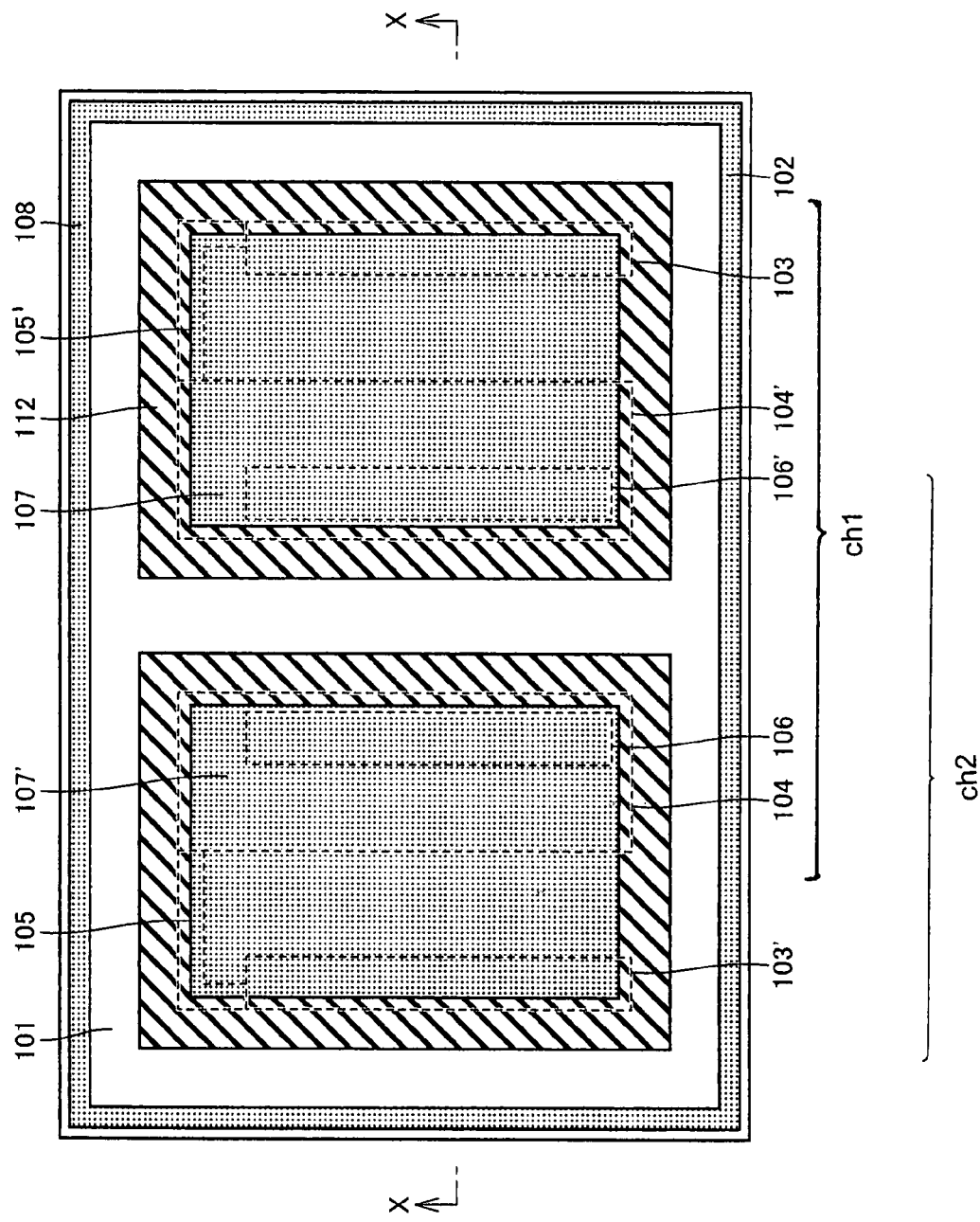
FIG. 9 is a plan view of another exemplary conventional bidirectional photothyristor device.
Figure 10:
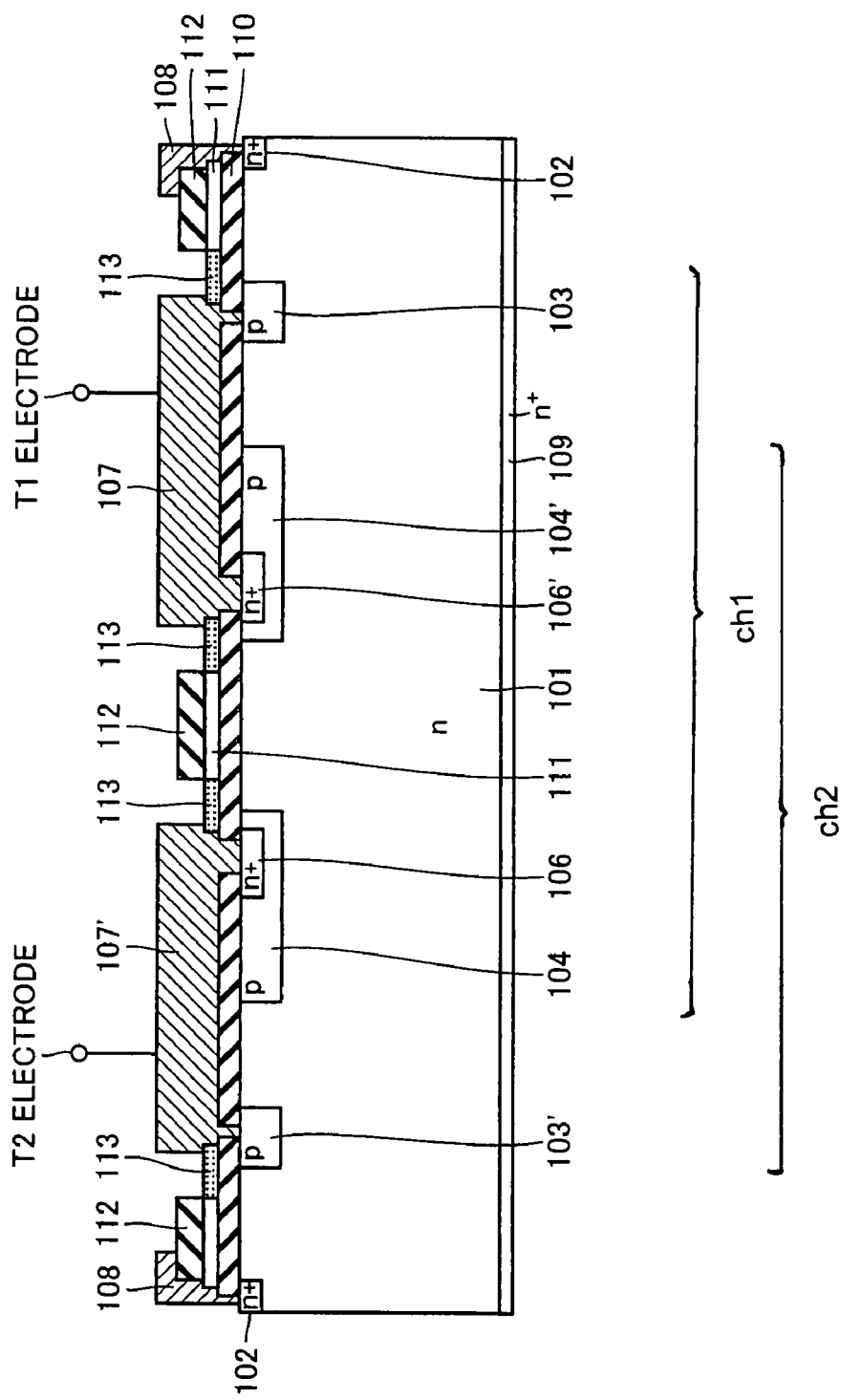
FIG. 10 is a cross sectional view taken along line X-X of FIG. 9.

FIG. 3 is a view showing a bidirectional photothyristor according to a second embodiment of the present invention. In FIGS. 9 and 10 showing a conventional bidirectional photothyristor, a low-resistance portion 113 is formed by locally injecting impurities such as phosphorus into oxygen-doped polysilicon 111. This low-resistance portion 113 serves as a substitute for a field plate electrode and also be optically transparent. Therefore, it is a structure for realizing high light sensitivity. However, due to the impurity doping such as phosphorus, an unnecessary level is generated at the interface of n-type silicon substrate 1 through oxide film 110. There is a possibility that carriers are trapped to the level resulting in variations or reduction of the current amplification factor $h_{FE}$ of the lateral-type pnp transistor constituted by anode diffusion region 103 (103'), n-type silicon substrate 1 and p-type gate diffusion region 104 (104').

With the bidirectional photothyristor according to this embodiment, this problem may be overcome by the structure shown in FIG. 3. Namely, outer portion 7b of electrode 7 (7') is contacted with the end portion of the doped low resistance portion (impurity-doped region) 13 of oxygen-doped polysilicon 11. Namely, it covers the portion of the impurity-doped region which lies in the vicinity of the interface between the impurity-doped region and the undoped-region. This placement may stabilize the electrical potential across low-resistance portion 13, thereby suppressing reduction or variations of the current amplification factor $h_{FE}$ of the pnp transistor.

In FIG. 3, a PSG film or BSG film 14 is interposed between the outer portion of the double-structured electrode and impurity-doped region (low-resistance portion) 13. In this structure in which the PSG film or BSG film is interposed, the outer electrode 7b is capacitive-coupled with the oxygen-doped polysilicon film through the PSG film or BSG film. Therefore, the structure shown in FIG. 3 is also effective in stabilizing the electrical potential across low-resistance portion 13, like the structure in which a PSG film or BSG film is not employed and outer electrode 7b is directly contacted with the impurity-doped portion.

Namely, even in the structure in which oxygen-doped polysilicon film 11 is doped with impurities, it is possible to stabilize the electrical potential across the opening portion at the oxygen-doped polysilicon film by employing the double-structured electrode. This may alleviate the influence of the impurity doping on the interface of silicon substrate 1. Further, as shown in FIG. 3, a PSG film or BSG film may be interposed between the outer electrode of the double-structured electrode and the oxygen-doped polysilicon film. Consequently, even with the structure in which oxygen-doped polysilicon film 1 is doped with impurities, there may be provided an effect of suppressing reduction or variations of the $h_{FE}$ of the pnp transistor to stabilize the light sensitivity.

FIRST EXAMPLE

Figure 7:
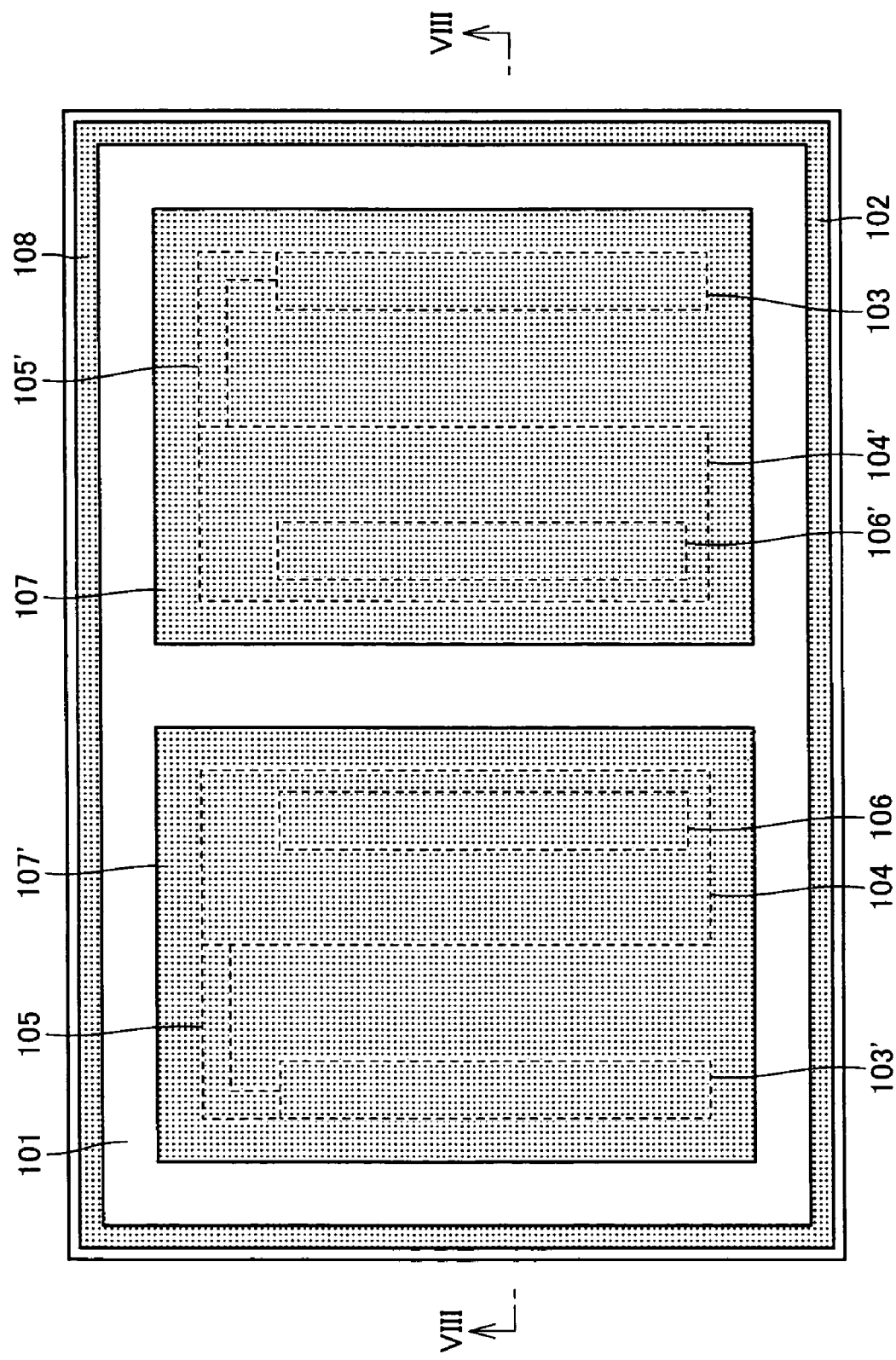
FIG. 7 is a plan view of an exemplary conventional bidirectional photothyristor device.
Figure 8:
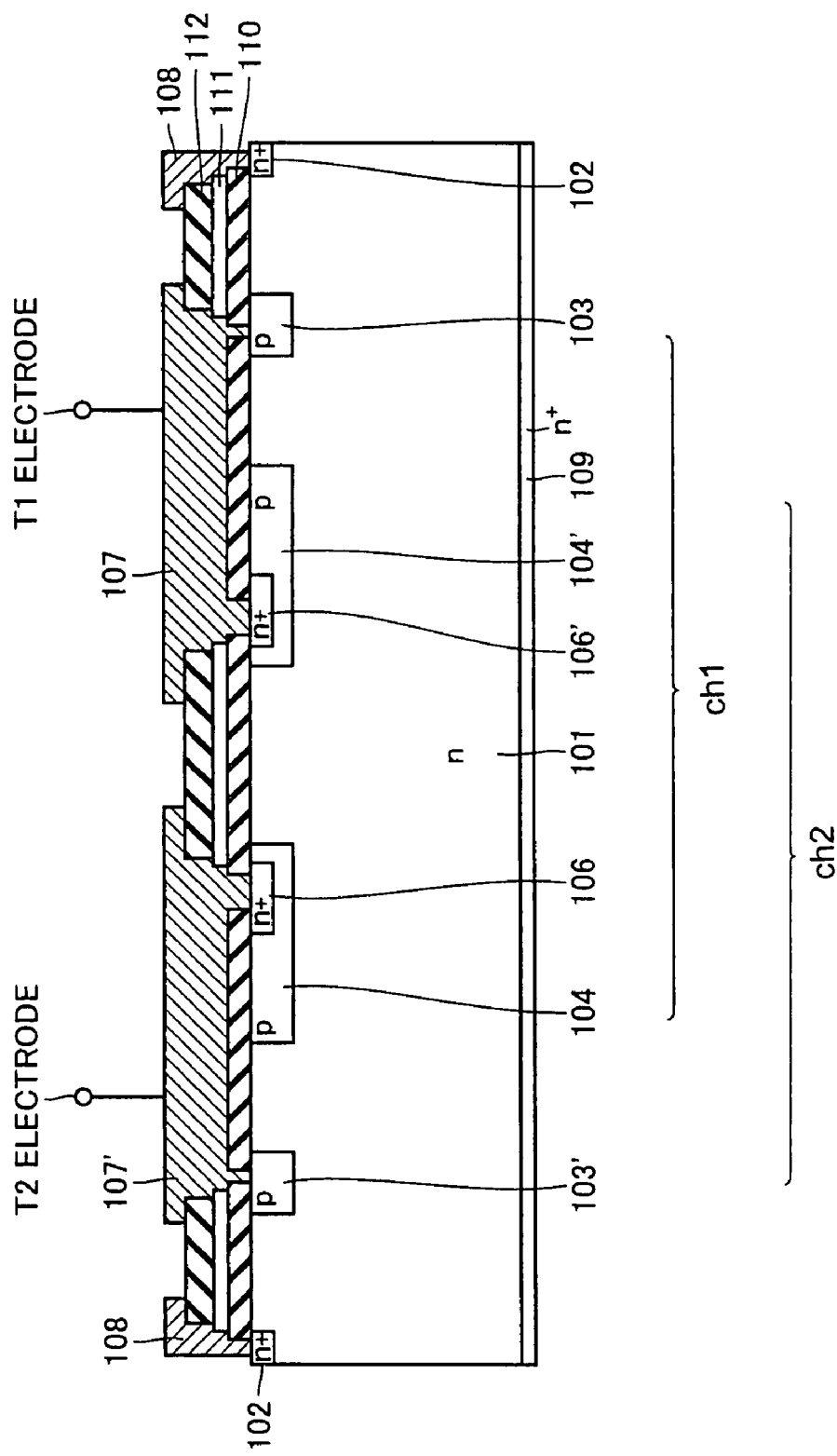
FIG. 8 is a cross sectional view taken along line VIII-VIII of FIG. 7.

The bidirectional photothyristor shown in FIG. 1 was actually fabricated as an example of the present invention, and was compared with the example of the prior art shown in FIGS. 7 and 8. Comparison of the breakdown strength performance was performed for the examples of the present invention and the prior art having the same chip size. This comparison revealed that both the examples had breakdown strength performance of 800 V or more. Namely, the example of present invention had an improved and less-varying sensitivity while maintaining the breakdown strength performance.

Figure 4:
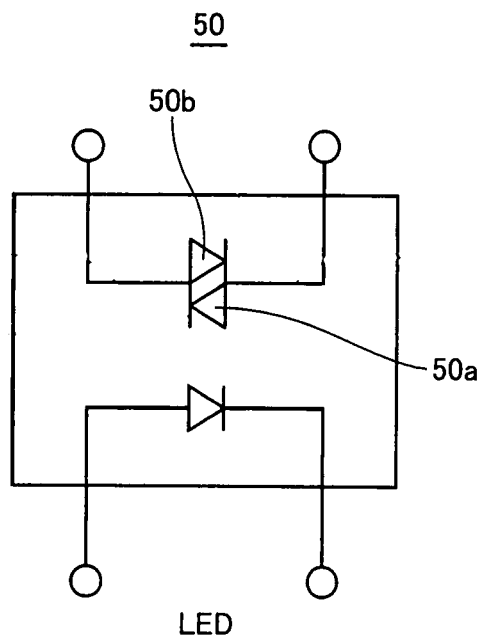
FIG. 4 is a wiring diagram showing a photocoupler according to a first example of the present invention.
Figure 5:
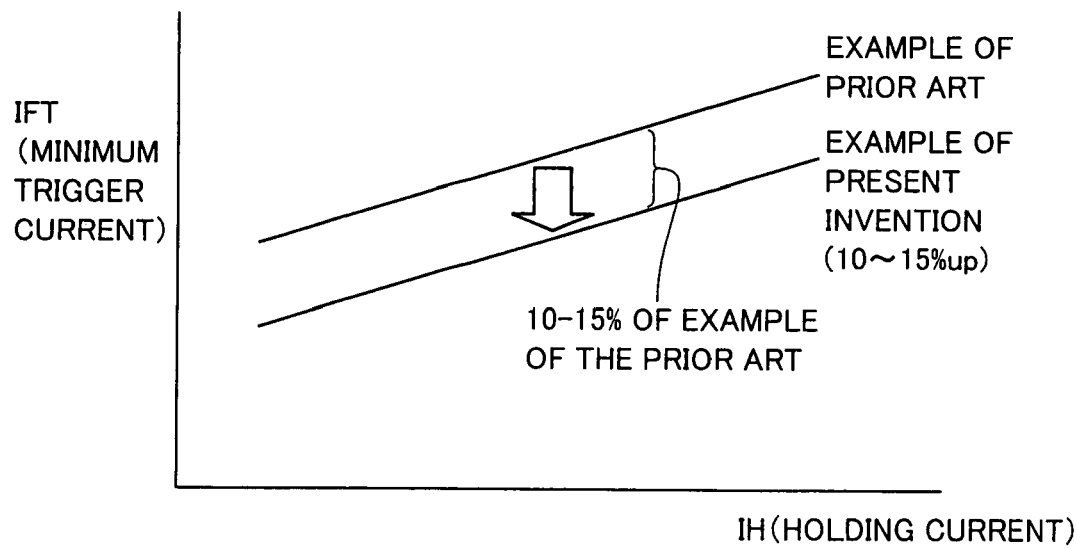
FIG. 5 shows the results of comparison of the sensitivities of examples of the present invention and the prior art in the first example.

Further, the light sensitivities (IFT; the minimum trigger current) of the example of the present invention and the example for comparison were measured, wherein these examples were combined with an LED (Light Emitting Diode) to form bidirectional thyristor couplers, as shown in FIG. 4. Here, the IFT is defined as an LED forward current which turns on the bidirectional photothyristor device when the forward current of the LED is gradually increased, under a predetermined bias voltage condition and a predetermined gate condition. The bidirectional photothyristor device shown in FIG. 1 was fabricated as the example of the present invention, as previously described, and the bidirectional photothyristor device shown in FIGS. 7 and 8 was fabricated as the example of the prior art. The results are shown in FIG. 5.

The example of the present invention had an IFT which had been improved by about 10 to 15% as compared with that of the example of the prior art for the same level of the IH (holding current). Here, IH (holding current) is a minimum anode (T1 or T2) current necessary for maintaining the device in the on state, under a predetermined temperature condition, a predetermined gate condition and on condition. The IH relates to noise characteristics (dv/dt, a commutation characteristic, or pulse noise) and for the same level of the IH there are equivalent noise characteristics. Consequently, for the same level of the IH as previously described, the example of the present invention had noise characteristics equivalent to those of the example of the prior art. The above dv/dt is a critical off voltage rising rate and is a maximum value of the off voltage rising rate which does not induce a transition from the off state to the on state when an exponential off voltage having a predetermined amplitude is being applied under a predetermined temperature condition and a predetermined gate condition. Here, the commutation characteristic is the following characteristic of triacs (bidirectional photothyristors). In the case where a triac is used with an inductive load, the triac is tend to turn on in the reverse direction at the time point the load current becomes zero, since a voltage of the opposite polarity is already generated at the time point the load current becomes zero due to a delay of the phase of the load current from the phase of the voltage.

SECOND EXAMPLE

Further, devices including a low-resistant portion formed by doping the oxygen-doped polysilicon film with impurities were fabricated and a comparison was performed. The example of the present invention was the bidirectional photothyristor device shown in FIG. 3 and the example of the prior art was the bidirectional photothyristor device shown in FIGS. 9, 10. For these two types of bidirectional photothyristor devices, the relation between the oxygen content and the hEF was determined. The results are shown in FIG. 6.

Figure 6:
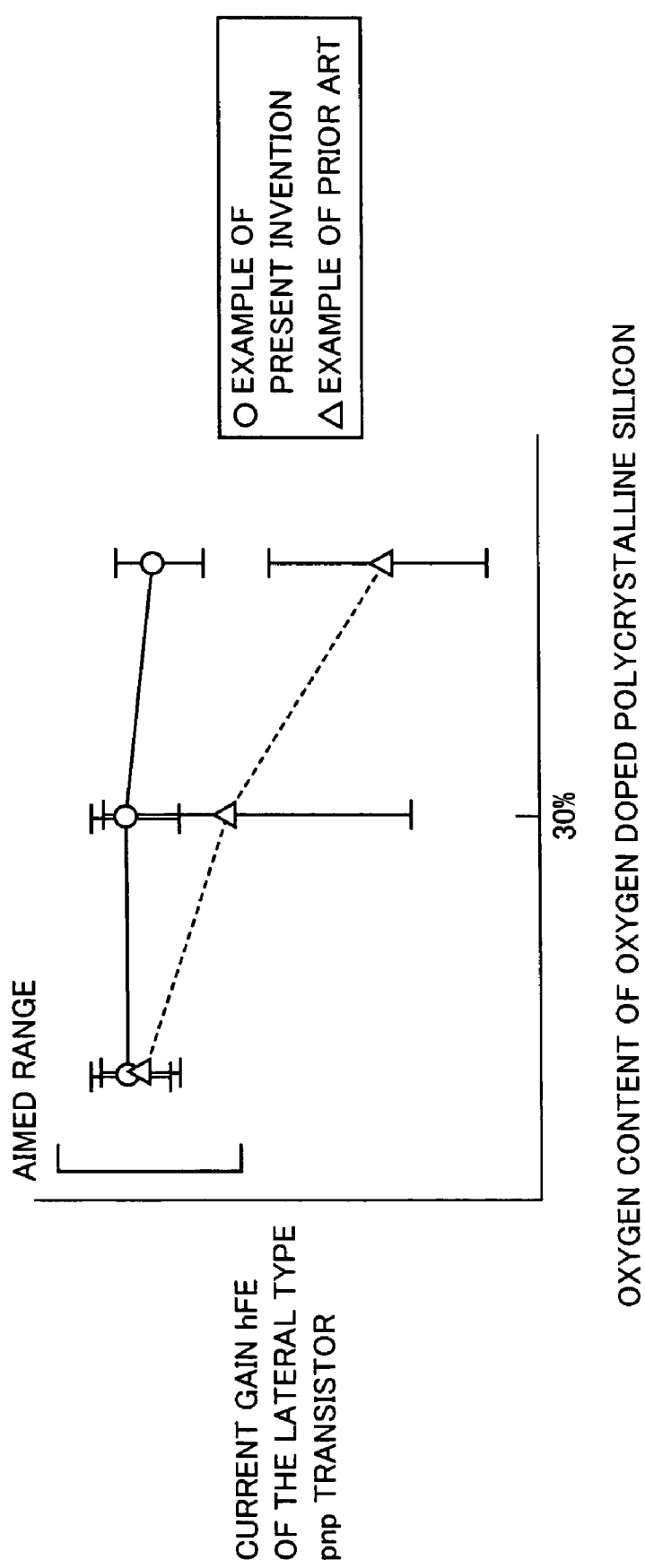
FIG. 6 shows the results of comparison of the variations of the current amplification factors $h_{FE}$ of the pnp transistors of examples of the present invention and the prior art in a second example.

Referring to FIG. 6, the example of prior art exhibited a large dependence of the hEF of the lateral type pnp transistor on the oxygen content of the oxygen-doped polysilicon film. Therefore, when the oxygen content became high, there were variations in the current amplification factor $h_{FE}$, resulting in large variations in the light sensitivity (IFT), which relates to the $h_{FE}$. This is considered to be caused by an unnecessary level at the interface of the silicon substrate. Such an unnecessary level is generated by increased dangling bonds due to an excessive amount of oxygen when the oxygen content of the oxygen-doped polysilicon film becomes high. On the contrary, when the oxygen content becomes low, there is an excessive amount of silicon which is conductive, resulting in increased leak current in the oxygen doped polysilicon film. Therefore, with the prior art structure, it is difficult to provide desired characteristics within an oxygen content control range (30±few %) during the formation of the oxygen-doped polysilicon film.

On the contrary, with the example of the present invention, the oxygen content of the oxygen doped polysilicon hardly affects the variation of the current amplification factor $h_{FE}$ of the pnp transistor and the $h_{FE}$ is maintained in a stabilized state. Therefore, variations in the light sensitivity may be suppressed, enabling stable mass production.

Next, there will be enumerated the embodiments of the present invention including the examples described in "Description of the Preferred Embodiments".

The center portion and the outer portion of the above electrode may be placed, in a plane view, not to be overlaid on the pn junction between the silicon substrate and one of the anode region and the cathode region in the region facing to the light receiving portion. For example, the center portion and the outer portion of the above electrode may be placed to sandwich, in a plane view, the pn junction between the silicon substrate and one of the anode region and the cathode region in the region facing to the light receiving portion.

With such a structure, the portions having the highest light-sensitivity may be irradiated with incident light, thereby ensuring high light sensitivity while maintaining breakdown strength.

The center portion and the outer portion of the above electrode may be spaced apart from each other by a distance of 50 µm to 1000 µm.

The center portion and the outer portion of the double-structured electrode may be spaced apart from each other by a distance of 50 µm to 1000 µm to form a sufficiently large opening portion at the light-receiving portion, thereby improving the light sensitivity. In the case where the above distance is less than 50 µm, a sufficiently large opening may not be formed. Also, in the case where the above distance exceeds 1000 µm, a large opening may be formed but a stabilized field plate effect may not be achieved. A more preferable distance is in a range from 100 µm to 500 µm.

The center portion and the outer portion of the above electrode may be electrically connected to the oxygen-doped polysilicon film.

With such a structure, the electrical potential may be stabilized to a constant value across the region of the oxygen-doped polysilicon film which lies between the contact portion of the center portion and the contact portion of the outer portion, which enables maintaining high breakdown strength while ensuring high light sensitivity.

The region of the oxygen-doped polysilicon film adjacent to the electrode may be doped with impurities other than oxygen. Also, the outer portion of the electrode may be overlaid on the region of the impurity-doped region which lies in the vicinity of the interface between the impurity-doped region and the undoped-region in the oxygen-doped polysilicon.

With such a structure, the polysilicon film having a lowered resistance may be utilized as a field plate electrode to achieve a field plate effect. Further, since the electrode has a double-structure consisting of the center portion and the outer portion, the electrical potential may be stabilized across the opening portion, reducing the influence of the impurity doping on the interface of silicon substrate.

There may be a PSG (Phospho Silicate Glass) film or BSG (Boro Silicate Glass) film interposed between the outer portion of the above electrode and the oxygen-doped polysilicon film.

By interposing a PSG film or BSG film between the outer portion and the low-resistance portion as previously described, the outer portion may be capacitive-coupled with the oxygen-doped polysilicon film through the PSG film or BSG film. Therefore, there is no need to form a narrow contact pattern of the PSG or BSG film. Consequently, stabilization of the electrical potential across the oxygen-doped polysilicon film may be achieved, which suppresses reduction of the current amplification factor $h_{FE}$ of the pnp transistor or variations in the light sensitivity due to impurity doping.

The bidirectional photothyristor device according to the present invention includes a pair of two photothyristor devices on a silicon substrate, each of the photothyristor devices being any one of the aforementioned photothyristor devices. A first photothyristor device of the two photothyristor devices has a first electrode, and the first electrode is electrically connected to one of an anode region and a cathode region of the first photothyristor device. A second photothyristor device has a second electrode, and the second electrode is electrically connected to one of an anode region and a cathode region of the second photothyristor device. The first electrode is also electrically connected to the other one of the anode region and the cathode region of the second photothyristor device which is not electrically connected to the second electrode, and the second electrode is also electrically connected to the other one of the anode region and the cathode region of the first photothyristor device which is not electrically connected to the first electrode. The bidirectional photothyristor device further includes an impurities region which serves as a channel stopper and is formed on the first main surface of the silicon substrate to surround the first and second photothyristor devices.

With this structure, it becomes possible to realize high breakdown strength and excellent light sensitivity, maintain the $h_{FE}$ of the pnp transistor at a high level, and suppress variations in the light sensitivity.

The above photothyristor devices or bidirectional photothyristor devices may be combined with, for example, an LED to form an optical coupler. Such an optical coupler forms a miniaturized, high-performance optical component since it employs the photothyristor or bidirectional photothyristor having a reduced size, high sensitivity and high breakdown strength.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photothyristor device comprising:
  a silicon substrate;
  a transistor portion including an anode region, a gate region and a cathode region and placed on a first main surface of the silicon substrate;
  a light-receiving portion for receiving light from the outside;
  an anode electrode and a cathode electrode each electrically connected to a corresponding one of said anode region and said cathode region; and
  a channel stopper electrode surrounding the anode electrode and the cathode electrode, said light receiving portion including an oxygen-doped polysilicon film placed above said silicon substrate and being disposed to surround said transistor portion,
  each of said anode electrode and said cathode electrode being placed above said transistor portion and having a double-structure comprising a center portion and an outer portion surrounding the center portion, the center portion and the outer portion being electrically connected, and an opening being provided between the center portion and the outer portion in each of the anode electrode and the cathode electrode so that at least part of a pn junction formed between the silicon substrate and the anode region is located in the opening in plan view of the photothyristor device.

2. A bidirectional photothyristor device comprising a pair of two photothyristor devices on said silicon substrate, each of said photothyristor devices being the photothyristor device according to claim 1, wherein
  a first photothyristor device of the two photothyristor devices has a first electrode and said first electrode is electrically connected to one of an anode region and a cathode region of the first photothyristor device,
  a second photothyristor device has a second electrode and said second electrode is electrically connected to one of an anode region and a cathode region of the second photothyristor device,
  said first electrode is electrically connected to the other one of said anode region and said cathode region of said second photothyristor device which is not electrically connected to said second electrode, and
  said second electrode is electrically connected to the other one of said anode region and said cathode region of said first photothyristor device which is not electrically connected to said first electrode,
  said bidirectional photothyristor device further comprising an impurity region which serves as a channel stopper and is formed on a first main surface of the silicon substrate to surround said first and second photothyristor devices.

3. An electronic apparatus comprising the bidirectional photothyristor device according to claim 2.

4. An electronic apparatus comprising the photothyristor device according to claim 1.

5. The photothyristor device according to claim 1, wherein said center portion and said outer portion of each of said anode electrode and said cathode electrode are spaced apart from each other by a distance of 50 μm to 1000 μm.

6. The photothyristor device according to claim 1, wherein said center portion and said outer portion of each of said anode electrode and said cathode electrode are electrically connected to said oxygen-doped polysilicon film.

7. The photothyristor device according to claim 6, wherein the region of said oxygen-doped polysilicon film adjacent to said electrode is doped with impurities other than oxygen.

8. A bidirectional photothyristor device comprising a pair of two photothyristor devices on said silicon substrate, each of said photothyristor devices being the photothyristor device according to claim 7, wherein
  a first photothyristor device of the two photothyristor devices has a first electrode and said first electrode is electrically connected to one of an anode region and a cathode region of the first photothyristor device,
  a second photothyristor device has a second electrode and said second electrode is electrically connected to one of an anode region and a cathode region of the second photothyristor device,
  said first electrode is electrically connected to the other one of said anode region and said cathode region of said second photothyristor device which is not electrically connected to said second electrode, and
  said second electrode is electrically connected to the other one of said anode region and said cathode region of said first photothyristor device which is not electrically connected to said first electrode,
  said bidirectional photothyristor device further comprising an impurity region which serves as a channel stopper and is formed on a first main surface of the silicon substrate to surround said first and second photothyristor devices.

9. The photothyristor device according to claim 7, wherein said outer portion of said electrode is overlaid on the region of said impurity-doped region which lies in the vicinity of the interface between the impurity-doped region and the undoped-region.

10. A bidirectional photothyristor device comprising a pair of two photothyristor devices on said silicon substrate, each of said photothyristor devices being the photothyristor device according to claim 9, wherein
  a first photothyristor device of the two photothyristor devices has a first electrode and said first electrode is electrically connected to one of an anode region and a cathode region of the first photothyristor device,
  a second photothyristor device has a second electrode and said second electrode is electrically connected to one of an anode region and a cathode region of the second photothyristor device,
  said first electrode is electrically connected to the other one of said anode region and said cathode region of said second photothyristor device which is not electrically connected to said second electrode, and
  said second electrode is electrically connected to the other one of said anode region and said cathode region of said first photothyristor device which is not electrically connected to said first electrode,
  said bidirectional photothyristor device further comprising an impurity region which serves as a channel stopper and is formed on a first main surface of the silicon substrate to surround said first and second photothyristor devices.

11. The photothyristor device according to claim 7, wherein a PSG (Phospho Silicate Glass) film or BSG (Boro Silicate Glass) film is interposed between said outer portion of said electrode and said impurity-doped region of said oxygen-doped polysilicon film.

12. A bidirectional photothyristor device comprising a pair of two photothyristor devices on said silicon substrate, each of said photothyristor devices being the photothyristor device according to claim 11, wherein a first photothyristor device of the two photothyristor devices has a first electrode and said first electrode is electrically connected to one of an anode region and a cathode region of the first photothyristor device, a second photothyristor device has a second electrode and said second electrode is electrically connected to one of an anode region and a cathode region of the second photothyristor device, said first electrode is electrically connected to the other one of said anode region and said cathode region of said second photothyristor device which is not electrically connected to said second electrode, and said second electrode is electrically connected to the other one of said anode region and said cathode region of said first photothyristor device which is not electrically connected to said first electrode, said bidirectional photothyristor device further comprising an impurity region which serves as a channel stopper and is formed on a first main surface of the silicon substrate to surround said first and second photothyristor devices.

* * * * *